US012641985B2

(12) United States Patent
 Choi et al.

(10) Patent No.: US 12,641,985 B2
(45) Date of Patent: May 26, 2026

(54) DISPLAY DEVICE AND METHOD FOR MANUFACTURING THE SAME

(71) Applicant: LG DISPLAY CO., LTD., Seoul (KR)

(72) Inventors: Inae Choi, Gyeonggi-do (KR); JongSung Kim, Gyeonggi-do (KR)

(73) Assignee: LG Display Co., Ltd. (KR)

( * ) Notice: Subject to any disclaimer, the term of this patent is extended or adjusted under 35 U.S.C. 154(b) by 543 days.

(21) Appl. No.: 18/083,603

(22) Filed: Dec. 19, 2022

(65) Prior Publication Data

US 2023/0217790 A1     Jul. 6, 2023

(30) Foreign Application Priority Data

Dec. 31, 2021    (KR) ........................ 10-2021-0194694

(51) Int. Cl.
 *H10K 59/80*       (2023.01)
 *H10K 102/00*      (2023.01)
(52) U.S. Cl.
 CPC ......... *H10K 59/878* (2023.02); *H10K 59/805* (2023.02); *H10K 2102/302* (2023.02)
(58) Field of Classification Search
 None
 See application file for complete search history.

(56) References Cited

FOREIGN PATENT DOCUMENTS

| KR | 10-2016-0074333 | A | 6/2016 |
| KR | 10-2016-0127459 | A | 11/2016 |
| KR | 20190079954 | A | 7/2019 |

OTHER PUBLICATIONS

Korean Office Action dated Nov. 6, 2024 issued in Patent Application No. 10-2021-0194694 (8 pages).
Office Action in Korean Appln. No. 10-2021-0194694, mailed on Aug. 5, 2025, 16 pages (with English translation).

*Primary Examiner* — Anthony Ho
(74) *Attorney, Agent, or Firm* — Fish & Richardson P.C.

(57) ABSTRACT

A display device and a method for manufacturing the same capable of mitigating light loss by comprising a substrate, an overcoat layer disposed on the substrate, a first electrode disposed on the overcoat layer, a reflective layer disposed on the overcoat layer to be spaced apart from the first electrode, a bank layer disposed on the first electrode and the reflective layer to cover en edge of the first electrode, a light emitting layer disposed on the first electrode, and a second electrode disposed on the light emitting layer and contacting an end of the reflective layer.

11 Claims, 22 Drawing Sheets

DISPLAY DEVICE AND METHOD FOR MANUFACTURING THE SAME

CROSS-REFERENCE TO RELATED APPLICATION

This application claims priority from Korean Patent Application No. 10-2021-0194694, filed on Dec. 31, 2021, which is hereby incorporated by reference in its entirety.

BACKGROUND

Field of the Disclosure

The present disclosure relates to a display device and a method for manufacturing the same.

Description of the Background

The growth of information society leads to various needs for displays and wide use of various forms of displays, such as liquid crystal displays (LCDs), plasma display panels (PDPs), or organic light emitting diode displays (OLEDs).

Among these display devices, the organic light emitting diode display is self-luminant and, due to no need for a backlight used in the liquid crystal display which is non-self luminant, may be made light and slim. Further, as compared with the liquid crystal display, the organic light emitting diode display has superior viewing angle and contrast ratio, is capable of low-DC voltage driving with reduced power consumption, has a high response rate and high resistance to external shocks thanks to its solid internal components, and has a wide use temperature range. Furthermore, the organic light emitting diode display has a simplified manufacturing process and save costs as compared with the liquid crystal display.

However, the organic light emitting display device experiences considerable light loss while the light emitted from the organic light emitting layer passes through several components in the organic light emitting display device to the outside.

SUMMARY

Accordingly, the present disclosure is to provide a display device and a method for manufacturing the same, capable of mitigating light loss and enhancing light extraction efficiency by forming a light encapsulation structure by placing a reflective layer in contact with a second electrode in the non-emission area of the organic light emitting display device.

Various aspects of the present disclosure is to provide a display device and a method for manufacturing the same, capable of mitigating light loss and enhancing light extraction efficiency.

In an aspect of the present disclosure, a display device includes a substrate, an overcoat layer disposed on the substrate, a first electrode disposed on the overcoat layer, a reflective layer disposed on the overcoat layer to be spaced apart from the first electrode, a bank layer disposed on the first electrode and the reflective layer to cover an edge of the first electrode, a light emitting layer disposed on the first electrode, and a second electrode disposed on the light emitting layer and contacting an end of the reflective layer.

In another aspect of the present disclosure, a method for manufacturing a display device includes forming an overcoat layer on a substrate, forming a reflective layer on the overcoat layer, forming a first electrode on the overcoat layer to be spaced apart from the reflective layer, forming a light emitting layer on the first electrode, and forming a second electrode on the light emitting layer to contact an end of the reflective layer.

Various aspects of the present disclosure is to provide a display device and a method for manufacturing the same, capable of mitigating light loss and enhancing light extraction efficiency by forming a light encapsulation structure by placing a reflective layer in contact with a second electrode in the non-emission area of the organic light emitting display device.

It is to be understood that both the foregoing general description and the following detailed description are exemplary and explanatory and are intended to provide further explanation of the disclosure as claimed.

DESCRIPTION OF DRAWINGS

The above and other features and advantages of the disclosure will be more clearly understood from the following detailed description, taken in conjunction with the accompanying drawings, in which:

FIGS. 7A, 7B, 7C, 7D, and 7E are views illustrating a process for manufacturing a display device according to aspects of the disclosure;

DETAILED DESCRIPTION

Hereinafter, aspects of the disclosure are described in detail with reference to the accompanying drawings. The same or substantially the same reference denotations are used to refer to the same or substantially the same elements throughout the specification and the drawings. When determined to make the subject matter of the disclosure unclear, the detailed of the known art or functions may be skipped. The terms "comprises" and/or "comprising," "has" and/or "having," or "includes" and/or "including" when used in this specification specify the presence of stated features, regions, integers, steps, operations, elements, and/or components, but do not preclude the presence or addition of one or more other features, regions, integers, steps, operations, elements, components, and/or groups thereof. As used herein, the singular forms "a", "an" and "the" are intended to include the plural forms as well, unless the context clearly indicates otherwise.

Such denotations as "first," "second," "A," "B," "(a)," and "(b)," may be used in describing the components of the disclosure. These denotations are provided merely to distinguish a component from another, and the essence of the components is not limited by the denotations in light of order or sequence.

In describing the positional relationship between components, when two or more components are described as "connected", "coupled" or "linked", the two or more components may be directly "connected", "coupled" or "linked", or another component may intervene. Here, the other component may be included in one or more of the two or more components that are "connected", "coupled" or "linked" to each other.

In relation to components, operational methods or manufacturing methods, when A is referred to as being "after," "subsequent to," "next," and "before," A and B may be discontinuous from each other unless mentioned with the term "immediately" or "directly."

When a component is designated with a value or its corresponding information (e.g., level), the value or the corresponding information may be interpreted as including a tolerance that may arise due to various factors (e.g., process factors, internal or external impacts, or noise).

Hereinafter, various aspects of the disclosure are described in detail with reference to the accompanying drawings.

Figure 1:
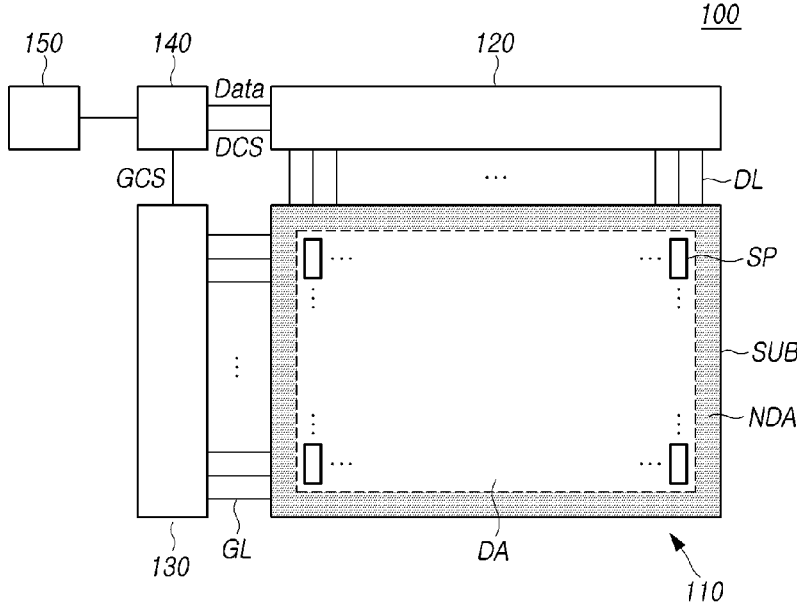
FIG. 1 is a view illustrating a system configuration of a display device according to aspects of the disclosure.

FIG. 1 is a view illustrating a system configuration of a display device 100 according to aspects of the disclosure;

Referring to FIG. 1, a display device 100 according to aspects of the disclosure may include a display panel 110 and driving circuits for driving the display panel 110.

The driving circuits may include a data driving circuit 120 and a gate driving circuit 130. The display device 100 may further include a controller 140 controlling the data driving circuit 120 and the gate driving circuit 130.

The display panel 110 may include a substrate SUB and signal lines, such as a plurality of data lines DL and a plurality of gate lines GL disposed on the substrate SUB. The display panel 110 may include a plurality of subpixels SP connected to the plurality of data lines DL and the plurality of gate lines GL.

The display panel 110 may include a display area DA in which images are displayed and a non-display area NDA in which no image is displayed. In the display panel 110, a plurality of subpixels SP for displaying images may be disposed in the display area DA, and the driving circuits 120, 130, and 140 may be electrically connected or disposed in the non-display area NDA. Further, pad units for connection of integrated circuits or a printed circuit may be disposed in the non-display area NA.

The data driving circuit 120 is a circuit for driving the plurality of data lines DL, and may supply data signals to the plurality of data lines DL. The gate driving circuit 130 is a circuit for driving the plurality of gate lines GL, and may supply gate signals to the plurality of gate lines GL. The controller 140 may supply a data control signal DCS to the data driving circuit 120 to control the operation timing of the data driving circuit 120. The controller 140 may supply a gate control signal GCS for controlling the operation timing of the gate driving circuit 130 to the gate driving circuit 130.

The controller 140 may start scanning according to a timing implemented in each frame, convert input image data input from the outside into image data Data suited for the data signal format used in the data driving circuit 120, supply the image data Data to the data driving circuit 120, and control data driving at an appropriate time suited for scanning.

To control the gate driving circuit 130, the controller 140 may output various gate control signals GCS including a gate start pulse GSP, a gate shift clock GSC, and a gate output enable signal (Gate Output Enable, GOE).

To control the data driving circuit 120, the controller 140 may output various data control signals DCS including, e.g., a source start pulse SSP, a source sampling clock SSC, and a source output enable signal SOE.

The controller 140 may be implemented as a separate component from the data driving circuit 120, or the controller 140, along with the data driving circuit 120, may be implemented as an integrated circuit.

The data driving circuit 120 receives the image data Data from the controller 140 and supply data voltages to the plurality of data lines DL, thereby driving the plurality of data lines DL. The data driving circuit 120 is also referred to as a 'source driving circuit.'

The data driving circuit 120 may include one or more source driver integrated circuit (SDICs).

For example, each source driver integrated circuit (SDIC) may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may output a gate signal of a turn-on level voltage or a gate signal of a turn-off level voltage according to the control of the controller 140. The gate driving circuit 130 may sequentially drive the plurality of gate lines GL by sequentially supplying gate signals of the turn-on level voltage to the plurality of gate lines GL.

The gate driving circuit 130 may be connected with the display panel 110 by TAB method or connected to a bonding pad of the display panel 110 by a COG or COP method or may be connected with the display panel 110 according to a COF method. Alternatively, the gate driving circuit 130 may be formed in a gate in panel (GIP) type, in the non-display area NDA of the display panel 110. The gate driving circuit 130 may be disposed on the substrate SUB or may be connected to the substrate SUB. In other words, the gate driving circuit 130 of a GIP type may be disposed in the non-display area NDA of the substrate SUB. The gate driving circuit 130 of a chip-on-glass (COG) type or chip-on-film (COF) type may be connected to the substrate SUB.

Meanwhile, at least one of the data driving circuit 120 and the gate driving circuit 130 may be disposed in the display area DA. For example, at least one of the data driving circuit 120 and the gate driving circuit 130 may be disposed not to overlap the subpixels SP or to overlap all or some of the subpixels SP.

When a specific gate line GL is opened by the gate driving circuit 130, the data driving circuit 120 may convert the image data Data received from the controller 140 into an analog data voltage and supply it to the plurality of data lines DL.

The data driving circuit 120 may be connected to one side (e.g., an upper or lower side) of the display panel 110. Depending on the driving scheme or the panel design scheme, data driving circuits 120 may be connected with both the sides (e.g., both the upper and lower sides) of the display panel 110, or two or more of the four sides of the display panel 110.

The gate driving circuit 130 may be connected to one side (e.g., a left or right side) of the display panel 110. Depending on the driving scheme or the panel design scheme, gate driving circuits 130 may be connected with both the sides (e.g., both the left and right sides) of the display panel 110, or two or more of the four sides of the display panel 110.

The controller 140 may be a timing controller used in typical display technology, a control device that may perform other control functions as well as the functions of the timing controller, or a control device other than the timing controller, or may be a circuit in the control device. The controller 140 may be implemented as various circuits or electronic components, such as an integrated circuit (IC), a field programmable gate array (FPGA), an application specific integrated circuit (ASIC), or a processor.

The controller 140 may be mounted on a printed circuit board or a flexible printed circuit and may be electrically connected with the data driving circuit 120 and the gate driving circuit 130 through the printed circuit board or the flexible printed circuit.

The display device 100 according to aspects of the disclosure may be a display including a backlight unit, such as a liquid crystal display, or may be a self-emission display, such as an organic light emitting diode (OLED) display, a quantum dot display, or a micro light emitting diode (LED) display.

If the display device 100 according to aspects of the disclosure is an OLED display, each subpixel SP may include an organic light emitting diode (OLED), which by itself emits light, as the light emitting element. If the display device 100 according to aspects of the disclosure is a quantum dot display, each subpixel SP may include a light emitting element formed of a quantum dot, which is a self-luminous semiconductor crystal. If the display device 100 according to aspects of the disclosure is a micro LED display, each subpixel SP may include a micro LED, which is self-emissive and formed of an inorganic material, as the light emitting element.

Figure 2:
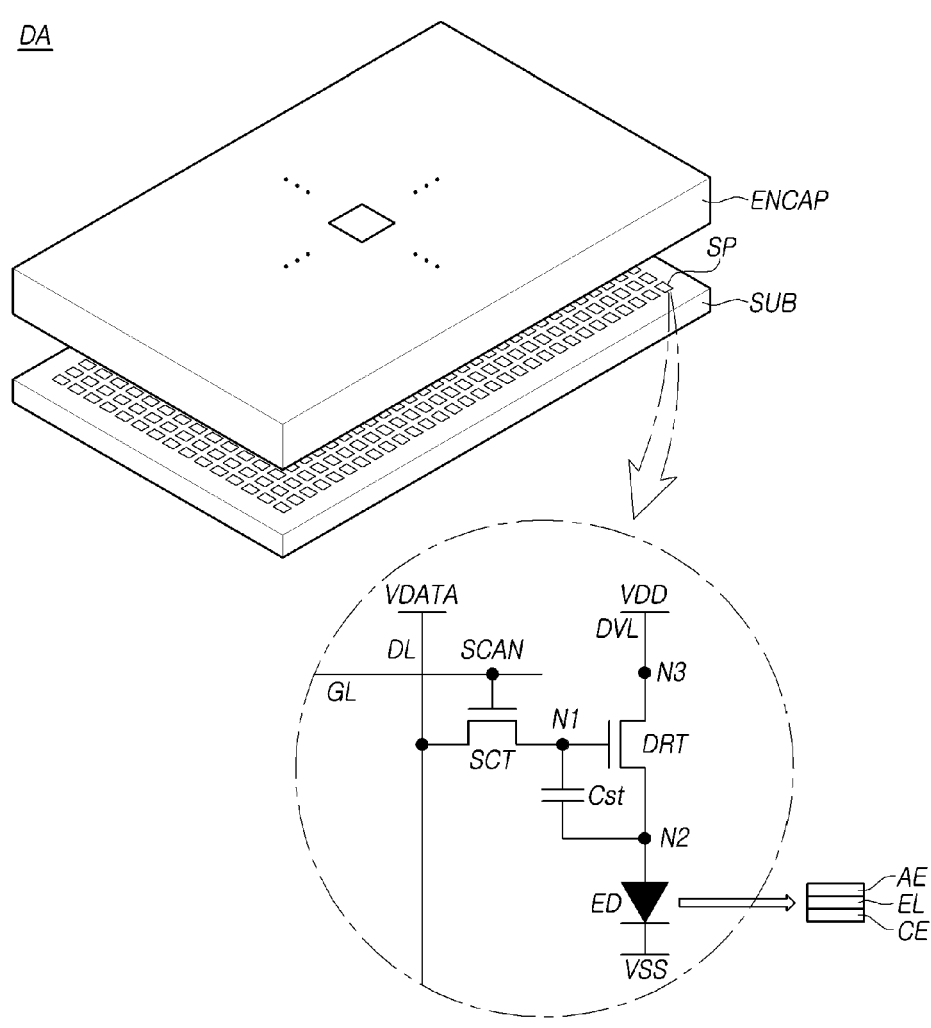
FIG. 2 is a view schematically illustrating a display panel according to aspects of the disclosure.

FIG. 2 is a view schematically illustrating a display panel 110 according to aspects of the disclosure.

Referring to FIG. 2, in a display panel 110 according to aspects of the disclosure, each subpixel SP may include a light emitting element ED, a driving transistor DRT for driving the light emitting element ED, a scan transistor SCT for transferring a data voltage VDATA to a first node N1 of the driving transistor DRT, and a storage capacitor Cst for maintaining a constant voltage during one frame.

The driving transistor DRT may include the first node N1 to which the data voltage may be applied, a second node N2 electrically connected with the light emitting element ED, and a third node N3 to which a driving voltage VDD is applied from a driving voltage line DVL. The first node N1 may be a gate node, the second node N2 may be a source node or a drain node, and the third node N3 may be the drain node or the source node.

The light emitting element ED may include an anode electrode AE, a light emitting layer EL, and a cathode electrode CE. The anode electrode AE may be a pixel electrode involved in forming the light emitting element ED of each subpixel SP and may be electrically connected to the second node N2 of the driving transistor DRT of each subpixel SP. The cathode electrode CE may be a common electrode involved in the light emitting elements ED of all the subpixels SP, and a ground voltage VSS may be applied thereto.

For example, the light emitting element ED may be an organic light emitting diode (OLED), an inorganic light emitting diode, or a quantum dot light emitting element. In this case, when the light emitting element ED is an organic light emitting diode, the light emitting layer EL of the light emitting element ED may include an organic light emitting layer including an organic material.

The scan transistor SCT may be on/off controlled by a scan signal SCAN, which is a gate signal, applied via the gate line GL and be electrically connected between the first node N1 of the driving transistor DRT and the data line DL.

The storage capacitor Cst may be electrically connected between the first node N1 and second node N2 of the driving transistor DRT.

Each subpixel SP may have a 2T (transistor) 1C (capacitor) structure which includes two transistors DRT and SCT and one capacitor Cst as shown in FIG. 2 and, in some cases, each subpixel SP may further include one or more transistors or one or more capacitors.

The capacitor Cst may be an external capacitor intentionally designed to be outside the driving transistor DRT, but not a parasite capacitor (e.g., Cgs or Cgd) which is an internal capacitor that may be present between the first node N1 and the second node N2 of the driving transistor DRT.

Each of the driving transistor DRT and the scan transistor SCT may be an n-type transistor or a p-type transistor.

Since the circuit elements (particularly, the light emitting element ED) in each subpixel SP are vulnerable to external moisture or oxygen, an encapsulation layer ENCAP may be disposed on the display panel 110 to prevent penetration of external moisture or oxygen into the circuit elements (particularly, the light emitting element ED).

The display device 100 according to aspects of the disclosure may have a top emission structure or a bottom emission structure. The bottom emission structure is described below as an example. For example, in the case of the bottom emission structure, the anode electrode AE may be a transparent conductive film, and the cathode electrode CE may be a reflective metal.

Figure 3:
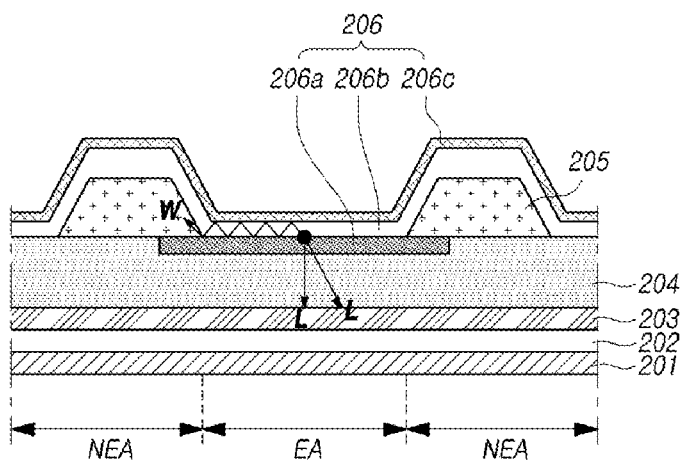
FIG. 3 is a view illustrating light reflection by a cathode and an anode.
Figure 4:
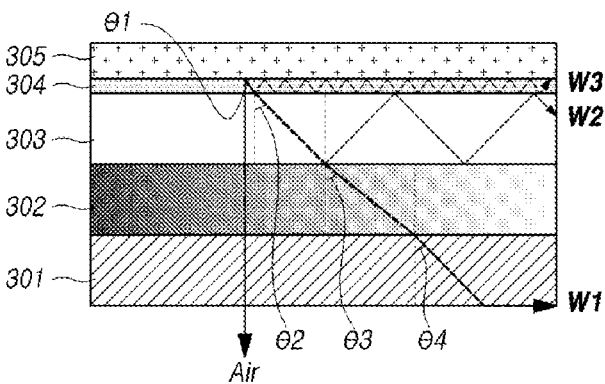
FIG. 4 is a view schematically illustrating an emission area of a display device.

FIG. 3 is a view illustrating light reflection by a cathode and an anode. FIG. 4 is a view schematically illustrating an emission area of an organic light emitting display device.

Referring to FIG. 3, a driving transistor TFT 202, a protection layer 203, an overcoat layer 204, a first electrode 206a and a bank layer 205 are disposed on the substrate 201.

An organic light emitting layer 206b is disposed on the first electrode 206a and a second electrode 206c positioned to face the first electrode 206a is positioned on the organic light emitting layer 206b.

In aspects of the disclosure, an example in which the first electrode 206a is an anode electrode and the second electrode 206c is a cathode electrode is described. However, aspects of the disclosure are not limited thereto but may also apply where the first electrode 206a is a cathode electrode and the second electrode 206c is an anode electrode.

The area where the first electrode 206a and the organic light emitting layer 206b directly contact is an emission area EA in which the organic light emitting layer 206b emits light, and the area where the bank layer 205 dividing the subpixels is positioned is a non-emission area NEA.

The light L emitted from the emission area EA is transmitted to the outside through the first electrode 206a which is a transparent electrode, the overcoat layer 204, the protection layer 203, the driving transistor 202, and the substrate 201.

Part of the light W emitted from the emission area EA is reflected by the first electrode 206a and the second electrode 206c to the non-emission area NEA and, light loss occurs due to the waveguide in the organic light emitting layer.

Referring to FIG. 4, in the emission area of the display device, a cover glass 301, a color filter 302, an overcoat layer 303, and an organic light emitting diode are formed. The organic light emitting diode includes a cathode electrode (not shown) into which electrons are injected, an anode electrode 304 into which holes are injected, and an organic light emitting layer 305 emitting light using the current formed between the cathode electrode and the anode electrode.

In this case, about 20% of the light generated by the organic light emitting layer 305 is lost due to the waveguide and total reflection in the organic light emitting diode.

In general, the refractive index of the organic light emitting layer 305 is 1.7 to 1.8, and the refractive index of indium tin oxide (ITO) used as the anode electrode 304 is about 1.8 to 2.2. The refractive index of the overcoat layer 303 is about 1.5 to 1.6, the refractive index of the color filter 302 is about 1.6 to 1.8, and the refractive index of the glass used as the cover glass 301 is 1.5 to 1.6, so that planar waveguides W2 and W3 are naturally formed inside the display device, causing light loss in the internal waveguide mode.

Further, since the refractive index of the cover glass 301 is about 1.5 to 1.6 and the refractive index of external air is 1.0, when the light exits through the cover glass 301 to the outside, the light W1 incident at a threshold angle or more is subjected to total reflection and is thus trapped in the cover glass 301, causing light loss.

To address such issues, the inventors of the disclosure mitigate light loss and enhance light extraction efficiency by forming a light encapsulation structure by placing a reflective layer in contact with a second electrode in the non-emission area of the organic light emitting display device.

Figure 5:
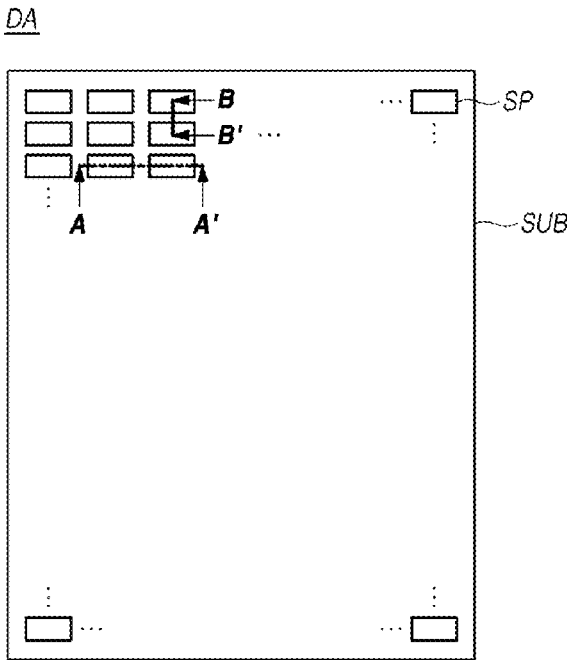
FIG. 5 is a view illustrating a display panel according to aspects of the disclosure.
Figure 6A:
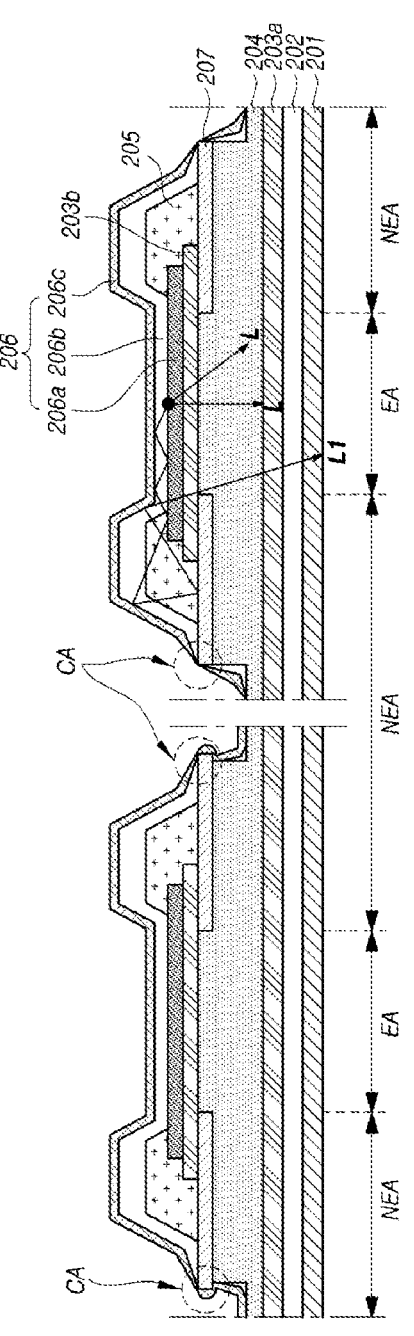
FIG. 6A is a cross-sectional view taken along line A-A' of FIG. 5.
Figure 6B:
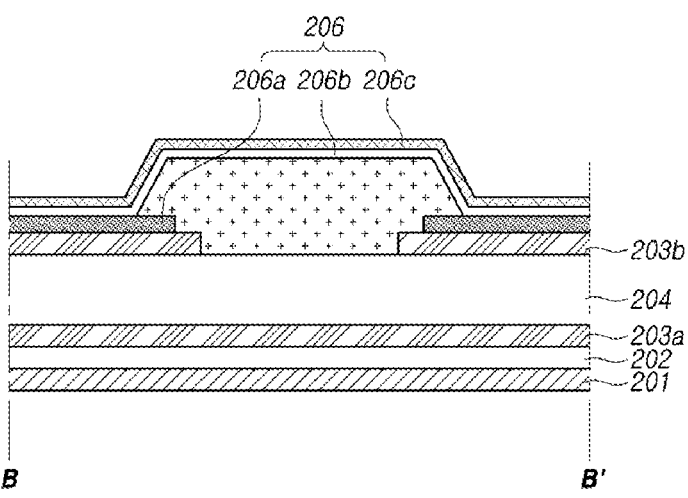
FIG. 6B is a cross-sectional view taken along line B-B' of FIG. 5.
Figure 7A:
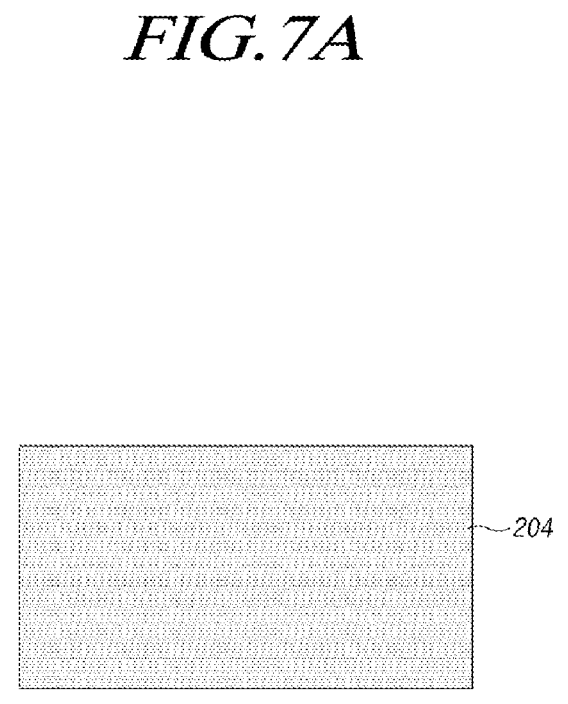
Figure 7B:
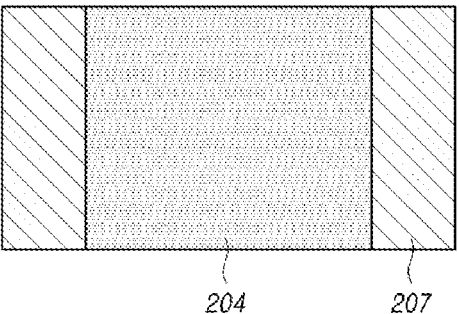
Figure 7C:
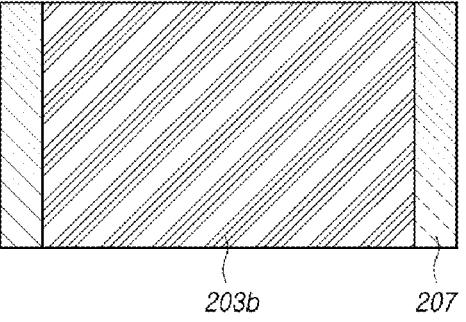
Figure 7D:
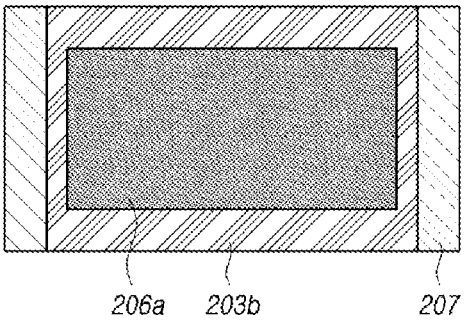
Figure 7E:
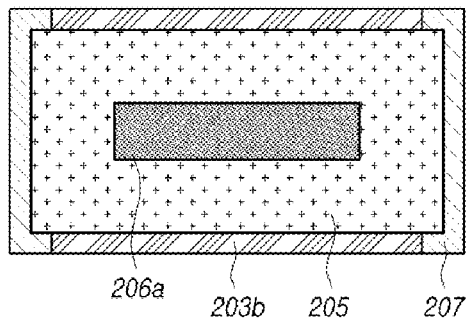
Figure 8:
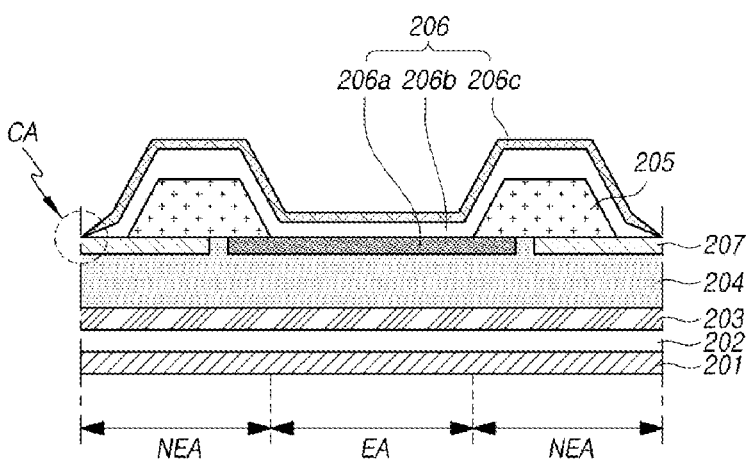
FIGS. 8, 9, and 10 are cross-sectional views illustrating another example of a display device according to aspects of the disclosure.
Figure 9:
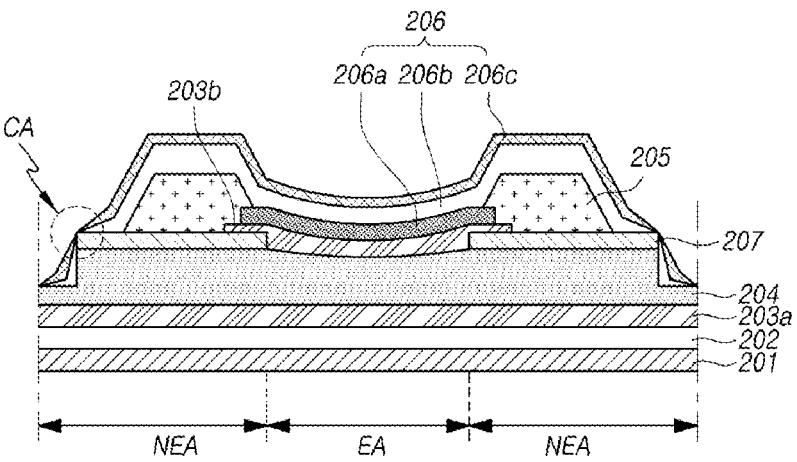
Figure 10:
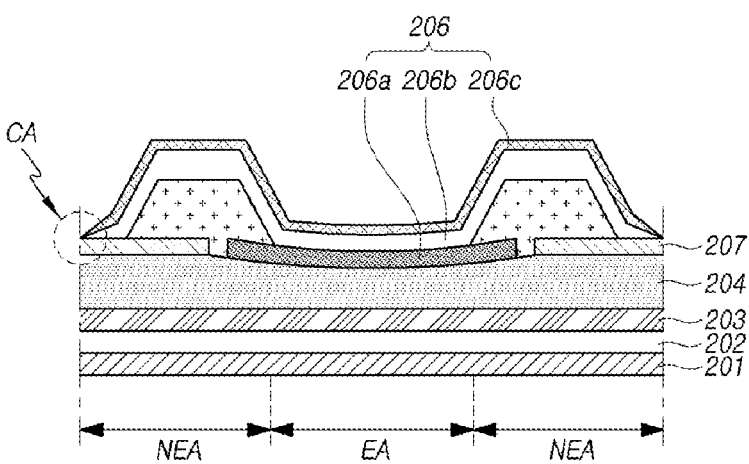

FIG. 5 is a view illustrating a display panel according to aspects of the disclosure, FIG. 6A is a cross-sectional view taken along line A-A' of FIG. 5, FIG. 6B is a cross-sectional view taken along line B-B' of FIG. 5, and FIGS. 7A, 7B, 7C, 7D, and 7E are views illustrating a process for manufacturing a display device according to aspects of the disclosure. FIGS. 8, 9, and 10 are cross-sectional views illustrating another example of a display device according to aspects of the disclosure.

Referring to FIGS. 5, 6A, 6B and 8, 9 and 10, in the display device according to aspects of the disclosure, an overcoat layer 204 is disposed on a substrate 201, and a first electrode 206a is disposed on the overcoat layer 204.

Referring to FIGS. 9 and 10, the overcoat layer 204 may include a pattern portion in an area where the first electrode 206a is disposed. The pattern portion may have a concave shape. The first electrode 206a is formed on the overcoat layer 204 to correspond to the shape of the pattern portion.

A driving transistor 202 including an active layer, a gate insulation film, a gate electrode, an inter-layer insulation film, and a drain electrode and a source electrode may be further disposed on the substrate 201 between the substrate 201 and the overcoat layer 204.

The drain electrode is connected to the driving voltage line DVL. The source electrode is connected to the first electrode 206a of the organic light emitting diode 206.

A protection layer 203a may be further disposed on the driving transistor 202.

In the display device according to aspects of the disclosure, the first electrode 206a may be an anode electrode, and the second electrode 206c may be a cathode electrode.

The first electrode 206a may be a transparent electrode. The second electrode 206c may be a reflective electrode.

The first electrode 206a may be formed of a metal, an alloy thereof, or a combination of a metal and a metal oxide and, since the display device is of the bottom emission type, the metal may be formed of one of ITO, IZO, ITO/APC/ITO, AlNd/ITO, Ag/ITO or ITO/APC/ITO which is a transparent conductive material.

A reflective layer 207 is disposed on the overcoat layer 204 to be spaced apart from the first electrode 206a.

Referring to FIGS. 6A and 9, the reflective layer 207 and the first electrode 206a are disposed on different layers to overlap with each other while being spaced apart from each other in a first direction which is the vertical direction in which the components of the display device according to aspects of the disclosure are stacked.

In this case, as the protection layer 203b is disposed between the reflective layer 207 and the first electrode 206a, the reflective layer 207 and the first electrode 206a may be spaced apart from and overlap each other in the vertical direction which is the first direction.

Referring to FIGS. 8 and 10, the reflective layer 207 and the first electrode 206a are disposed on a same layer without overlap with each other, and one end of the first electrode 206a is spaced apart from the other end of the reflective layer 207 in a second direction which is the horizontal direction. The reflective layer 207 may be disposed between adjacent subpixels in one direction, and not disposed between adjacent subpixels in another direction. FIG. 6B illustrates a cross section between adjacent subpixels disposed in the column direction in FIG. 5. The reflective layer 207 is disposed between adjacent subpixels disposed in the transverse direction and may not be disposed between adjacent subpixels disposed in the column direction. In other words, referring to FIG. 7B, the reflective layer 207 may be disposed in the column direction and may not be disposed in the traverse direction.

The reflective layer 207 is formed of one of Ti, Mo, Cr, W, V, Ta, Cu, and Al, or a reflective metal including any one thereof.

In the display device according to aspects of the disclosure, the substrate 201 may include an emission area EA and a non-emission area NEA, and the reflective layer 207 may be disposed in the non-emission area NEA and be spaced apart from the first electrode 206a.

A bank layer 205 partitioning subpixels is disposed on the first electrode 206a and the reflective layer 207. One end of the reflective layer 207 may extend beyond the bank layer 205 without being covered by the bank layer 205 to contact the second electrode 206c.

An organic light emitting layer 206b is disposed on the first electrode 206a.

The organic light emitting layer 206b may be formed in a multi-layer structure including a hole injection layer, a hole transport layer, a light emitting layer (also referred to as an emitting material layer), an electron transport layer, and an electron injection layer to increase light emission efficiency.

A second electrode 206c that contacts one end of the reflective layer 207 to form a contact portion CA is disposed on the organic light emitting layer 206b.

The light L emitted from the emission area EA is transmitted to the outside through the first electrode 206a which is a transparent electrode, the overcoat layer 204, the protection layers 203a and 203b, the driving transistor 202, and the substrate 201.

Part of the light L1 emitted from the emission area EA is reflected from the first electrode 206a and the second electrode 206c to the non-emission area NEA. The light L1 reflected from the second electrode 206c positioned in the non-emission area NEA is re-reflected by the reflective layer 207 contacting the second electrode 206c and escapes to the outside through the first electrode 206a which is the transparent electrode, the overcoat layer 204, the protection layers 203a and 203b, the driving transistor 202, and the substrate 201.

In other words, according to the display device according to aspects of the disclosure, a light encapsulation structure is formed through contact between the second electrode 206c and the reflective layer 207 disposed in the non-emission area NEA, allowing the light, which may be trapped by the waveguide without being extracted from the emission area EA, to be extracted to the outside through the reflective layer 207, with the result of mitigated light loss and enhanced light extraction efficiency.

FIGS. 7A, 7B, 7C, 7D, and 7E are views illustrating a process for manufacturing a display device according to aspects of the disclosure.

Referring to FIGS. 7A to 7E, in the display device according to aspects of the disclosure, an overcoat layer 204 is formed on a substrate and then a reflective layer 207 is formed on the overcoat layer 204.

The step of forming the overcoat layer 204 may include the step of forming a pattern portion on the overcoat layer 204.

The step of forming the reflective layer 207 may include the step of forming a protection layer 203b on the overcoat layer 204 and a portion of the reflective layer 207 overlapping the first electrode 206a to space the reflective layer 207 and the first electrode 206a apart from each other.

After the reflective layer 207 is formed, the first electrode 206a is formed on the overcoat layer 204 to be spaced apart from the reflective layer 207.

In the step of forming the first electrode 206a, the first electrode 206a may be formed on the pattern portion formed on the overcoat layer 204.

After the first electrode 206a is formed, a bank layer 205 is formed on an edge of the first electrode 206a to expose one end of the reflective layer 207, an organic light emitting layer 206b is formed on the first electrode 206a, and a second electrode 206c is formed on the organic light emitting layer 206b to contact one end of the reflective layer 207 exposed by the bank layer 205, completing the display device.

Figure 11:
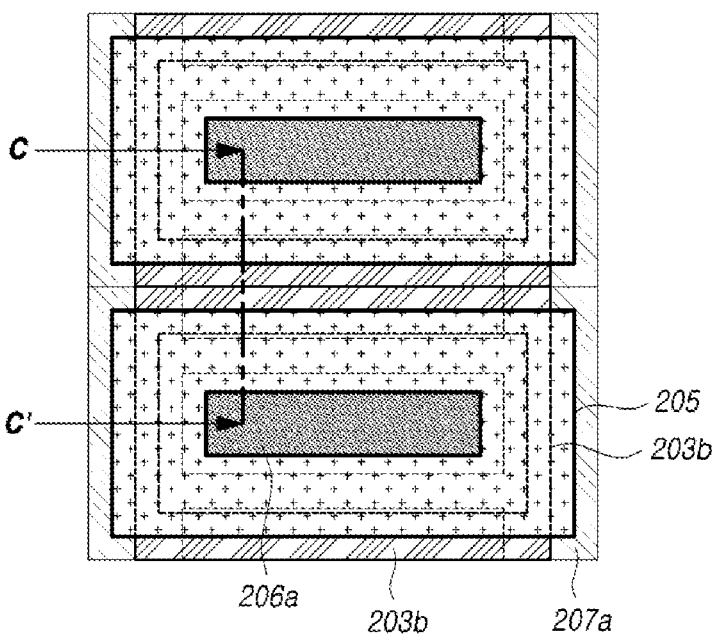
FIG. 11 is a view illustrating another example of a subpixel according to aspects of the disclosure.
Figure 12:
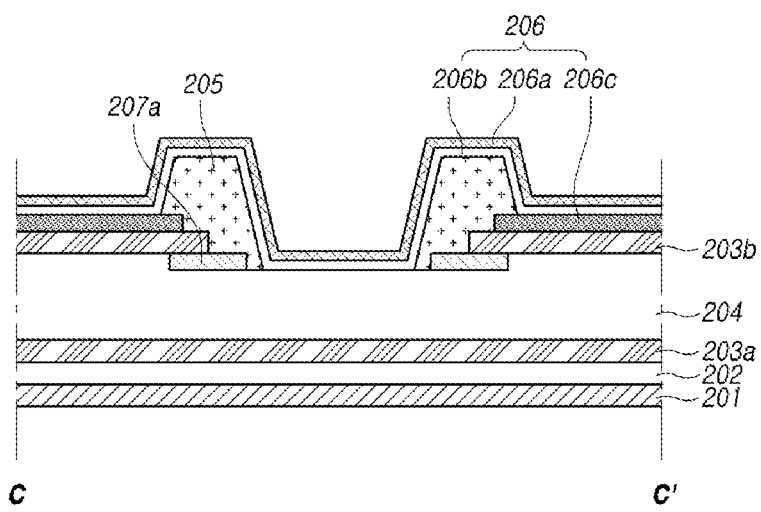
FIG. 12 is a cross-sectional view taken along line C-C' of FIG. 11.
Figure 13A:
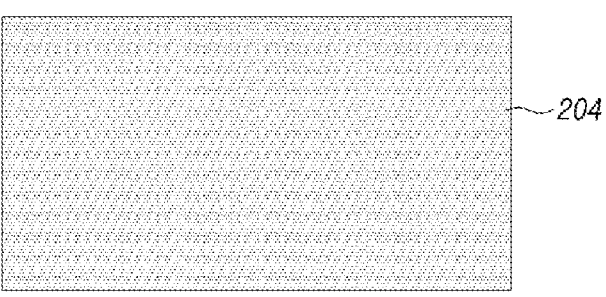
FIGS. 13A, 13B, 13C, 13D, and 13E are views illustrating another process for manufacturing a display device according to FIG. 12.
Figure 13B:
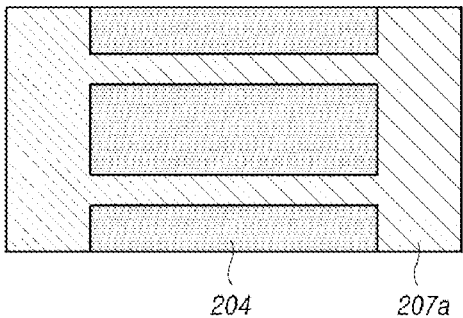
Figure 13C:
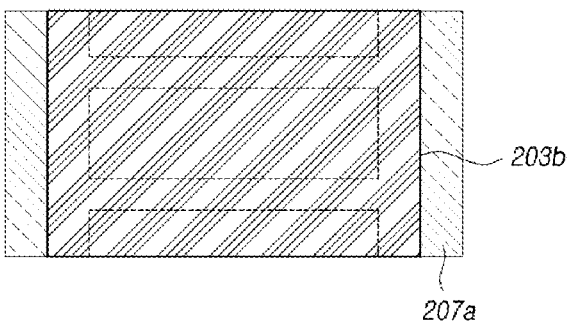
Figure 13D:
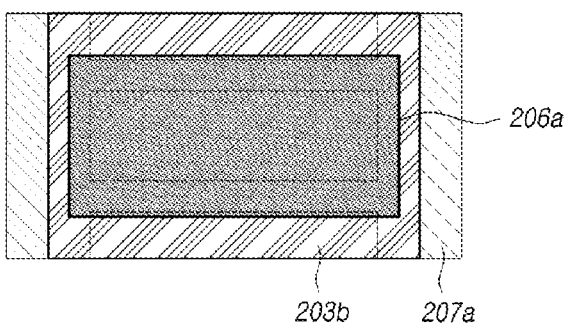
Figure 13E:
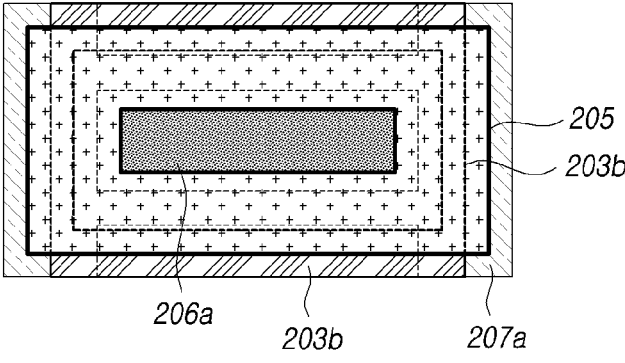

FIG. 11 is a view illustrating another example of a subpixel according to aspects of the disclosure, and FIG. 12 is a cross-sectional view taken along line C-C' of FIG. 11.

Referring to FIGS. 11 and 12, the reflective layer 207a is disposed in the column direction and the transverse direction between the subpixels. The reflective layer 207a may be formed so that a portion thereof disposed in the transverse direction is narrower than a portion thereof disposed in the column direction. In this case, the reflective layer 207a disposed in the transverse direction is disposed to be spaced apart from the first electrode 206a but not to contact the second electrode 206c.

FIGS. 13A to 13E are views illustrating a process for manufacturing the subpixel illustrated in FIG. 11, which is another aspect of the disclosure.

Referring to FIGS. 13A to 13E, in the subpixel according to aspects of the disclosure, an overcoat layer 204 is formed on a substrate and then a reflective layer 207a is formed on the overcoat layer 204.

The reflective layer 207a may be formed in a column direction and a transverse direction between the subpixels, and the portion disposed in the transverse direction is formed to be narrower than the portion disposed in the column direction.

The step of forming the overcoat layer 204 may include the step of forming a pattern portion on the overcoat layer 204.

The step of forming the reflective layer 207a may include the step of forming a protection layer 203b on the overcoat layer 204 and a portion of the reflective layer 207a overlapping the first electrode 206a to space the reflective layer 207a and the first electrode 206a apart from each other.

After the reflective layer 207a is formed, the first electrode 206a is formed on the overcoat layer 204 to be spaced apart from the reflective layer 207a.

In the step of forming the first electrode 206a, the first electrode 206a may be formed on the pattern portion formed on the overcoat layer 204. After the first electrode 206a is formed, a bank layer 205 is formed on an edge of the first electrode 206a to expose one end of the reflective layer 207 in the transverse direction, an organic light emitting layer 206b is formed on the first electrode 206a, and the second electrode 206c is formed on the organic light emitting layer 206b to contact one end of the reflective layer 207a in the transverse direction but not to contact one end of the reflective layer 207a in the column direction, completing the display device.

As such, in the display device according and method for manufacturing the same according to aspects of the disclosure, a light encapsulation structure is formed through contact between the second electrode 206c and the reflective layer 207 disposed in the non-emission area NEA, allowing the light, which may be trapped by the waveguide without being extracted from the emission area EA, to be extracted to the outside through the reflective layer 207, with the result of mitigated light loss and enhanced light extraction efficiency.

The above-described aspects are merely examples, and it will be appreciated by one of ordinary skill in the art various changes may be made thereto without departing from the scope of the disclosure. Accordingly, the aspects set forth herein are provided for illustrative purposes, but not to limit the scope of the disclosure, and should be appreciated that the scope of the disclosure is not limited by the aspects.

What is claimed is:

1. A display device, comprising:
   a substrate;
   an overcoat layer disposed on the substrate;
   a first electrode disposed on the overcoat layer;
   a reflective layer disposed on the overcoat layer and spaced apart from the first electrode;
   a bank layer disposed on the first electrode and the reflective layer to cover an edge of the first electrode;
   a light emitting layer disposed on the first electrode; and
   a second electrode disposed on the light emitting layer,
   wherein the reflective layer extends along a top surface of the overcoat layer, and the second electrode contacts an end of the reflective layer placed on the top surface of the overcoat layer.

2. The display device of claim 1, wherein the reflective layer and the first electrode are disposed on different layers, in a cross-section view.

3. The display device of claim 2, further comprising a protection layer disposed between the reflective layer and the first electrode, in the cross-section view.

4. The display device of claim 1, wherein the reflective layer and the first electrode are disposed on a same layer.

5. The display device of claim 1, wherein the substrate includes an emission area and a non-emission area, and
wherein the reflective layer is disposed in the non-emission area.

6. The display device of claim 1, wherein the end of the reflective layer extends beyond the bank layer to contact the second electrode.

7. The display device of claim 1, wherein the reflective layer includes a reflective metal.

8. The display device of claim 1, wherein the overcoat layer includes a pattern portion in an area where the first electrode is disposed.

9. The display device of claim 8, wherein the pattern portion has a concave shape.

10. The display device of claim 1, wherein the first electrode is a transparent electrode, and the second electrode is a reflective electrode.

11. The display device of claim 1, wherein the light emitting layer is disposed on the first electrode, the bank layer and the reflective layer,
the overcoat layer has a first thickness and a second thickness to form a step portion, and the end of the reflective layer extends to the step portion,
the light emitting layer is disconnected at the step portion to allow the second electrode to contact the end of the reflective layer.

* * * * *